United States Patent
Ramaswamy et al.

(10) Patent No.: US 7,746,182 B2
(45) Date of Patent: Jun. 29, 2010

(54) SYSTEMS AND METHODS FOR VOLTAGE CONTROLLED OSCILLATOR CALIBRATION

(75) Inventors: Sridhar Ramaswamy, Plano, TX (US); Mustafa Ulvi Erdogan, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 51 days.

(21) Appl. No.: 12/117,806

(22) Filed: May 9, 2008

(65) Prior Publication Data

US 2009/0115537 A1    May 7, 2009

Related U.S. Application Data

(60) Provisional application No. 60/985,067, filed on Nov. 2, 2007.

(51) Int. Cl.
*G01R 23/00*   (2006.01)
(52) U.S. Cl. .............................. 331/44; 331/11; 331/34; 331/177 R
(58) Field of Classification Search .................. 331/1 A, 331/10, 44, 177 R, 167, 17 R, 11, 34
See application file for complete search history.

(56) References Cited

U.S. PATENT DOCUMENTS

| | | | | |
|---|---|---|---|---|
| 6,563,387 | B2* | 5/2003 | Hirano et al. | 331/11 |
| 6,597,249 | B2* | 7/2003 | Chien et al. | 331/177 R |
| 7,023,284 | B2* | 4/2006 | Sogawa et al. | 331/10 |
| 2005/0083137 | A1* | 4/2005 | Lee et al. | 331/16 |
| 2007/0247248 | A1* | 10/2007 | Kobayashi et al. | 331/167 |

* cited by examiner

*Primary Examiner*—Joseph Chang
*Assistant Examiner*—Jeffrey Shin
(74) *Attorney, Agent, or Firm*—John J. Patti; Wade J. Brady, III; Frederick J. Telecky, Jr.

(57) ABSTRACT

Various systems, methods and apparatus for calibrating a clock generating circuit are discussed herein. As one example, a method for calibrating a voltage controlled oscillator is disclosed. The method includes fixing the control voltage of a fine tune capacitor in the voltage controlled oscillator at a predetermined level. A binary search is performed in a digital circuit for a value of a calibration word that is used to enable switched capacitors in a coarse tune capacitor bank in the voltage controlled oscillator. The calibration word is fixed at the value determined by the binary search, and the control voltage of the fine tune capacitor is released to enable adjustment of the control voltage by a feedback signal to the voltage controlled oscillator.

19 Claims, 7 Drawing Sheets

SYSTEMS AND METHODS FOR VOLTAGE CONTROLLED OSCILLATOR CALIBRATION

CROSS REFERENCE TO RELATED APPLICATION

The present application claims priority to (i.e., is a non-provisional of) U.S. Pat. App. No. 60/985,067 entitled "Auto-Calibration Algorithm and Circuit for Wide Tuning Range VCOs", and filed Nov. 2, 2007 by Ramaswamy et al. The aforementioned application is assigned to an entity common hereto, and the entirety of the aforementioned application is incorporated herein by reference for all purposes.

BACKGROUND OF THE INVENTION

The present invention is related to clock synthesizing, and in particular to calibration of voltage controlled oscillators.

Electronic circuits often use clock signals to regulate and control their operation. Events in the electronic circuits are timed by rising and/or falling edges of the clock signals. Clock signals may be generated by a number of oscillating circuits, such as an LC voltage controlled oscillator (VCO). In this type of oscillating circuit, an electrical charge is alternately accumulated and discharged to form the basis of the clock signal. The charge accumulates in inductors and capacitors of an LC tank circuit in the VCO, and the time needed for the charge to accumulate and discharge is based on the inductance and capacitance values. The frequency of the clock signal in one exemplary VCO may thus be controlled by varying the capacitance of the LC tank circuit in the VCO. For example, the VCO may include a voltage controlled variable capacitor so that the voltage of a control signal may be used to control the output frequency.

It is often desirable for a VCO to have a wide tuning range so that the VCO may be tuned to produce any of a wide range of output frequencies. The gain of the VCO may be increased so that is more sensitive to the voltage of the control signal, allowing the input voltage to select a wider range of capacitance values in the VCO and produce a wider range of output frequencies. However, increasing the gain of the VCO also makes it more susceptible to electrical noise on the control signal. A very sensitive VCO may have difficulties locking onto a reference frequency, because noise on the control signal can make the output frequency of the VCO fluctuate too greatly.

Hence, for at least the aforementioned reasons, there exists a need in the art for advanced VCOs.

BRIEF SUMMARY OF THE INVENTION

The present invention is related to clock synthesizing, and in particular to calibration of voltage controlled oscillators.

Some embodiments of the present invention provide methods for calibrating a voltage controlled oscillator that include fixing the control voltage of a fine tune capacitor in the voltage controlled oscillator at a predetermined level. A binary search is performed in a digital circuit for a value of a calibration word that is used to enable switched capacitors in a coarse tune capacitor bank in the voltage controlled oscillator. The calibration word is fixed at the value determined by the binary search, and the control voltage of the fine tune capacitor is released to enable adjustment of the control voltage by a feedback signal to the voltage controlled oscillator. In some instances of the aforementioned embodiments, the method of calibrating a voltage controlled oscillator further includes using an analog circuit to select a value of a least significant bit of the calibration word and the calibration word is fixed at the value determined by the binary search and the analog circuit.

Other embodiments of the present invention provide apparatus for generating a clock signal. The apparatus may include a voltage controlled oscillator having a bank of switchable capacitors and a voltage controlled adjustable capacitor. A calibration engine having a calibration word output is connected to the bank of switchable capacitors in the voltage controlled oscillator. The calibration engine includes a digital binary search circuit having a multi-bit parallel output connected to the calibration word output, a reference frequency input and a clock input that is connected to an output of the voltage controlled oscillator. In some particular instances of the aforementioned embodiments, the calibration engine also includes an analog tuning circuit having a one bit output, a reference frequency input and a clock input. The one bit output is connected to a least significant bit of the calibration word output and the analog tuning circuit clock input is connected to the output of the voltage controlled oscillator.

Yet other embodiments of the present invention provide systems for generating a clock signal. The apparatus includes a means for providing an oscillating electrical signal, a means for controlling the frequency of the oscillating electrical signal and a means for calibrating the frequency control means. The means for controlling the frequency includes means for coarse tuning and means for fine tuning. The means for calibrating includes a digital circuit that generates a calibration word for enabling at least one switchable capacitor in the means for coarse tuning. In some instances of the aforementioned embodiments, the means for calibrating also includes an analog circuit for determining a least significant bit of the calibration word.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to clock synthesizing, and in particular to calibration of voltage controlled oscillators.

In various embodiments of the present invention, an LC voltage controlled oscillator (VCO) with a wide tuning range using only limited gain is disclosed on the feedback signal to the VCO. The VCO includes a combination of a bank of switchable capacitors for coarse tuning and a voltage controlled capacitor such as a varactor for fine tuning. The coarse tuning is performed by selecting the capacitance of the capacitor bank, and the fine tuning is then performed by adjusting the voltage controlled capacitor to maintain a lock with a reference frequency under the control of a feedback signal. The coarse tuning is performed during a calibration that may be run when desired, such as when a circuit containing the VCO is initially powered on or is reset. The calibration includes one or more processes used to select a calibration word that enables the appropriate capacitors in the capacitor bank. As the capacitor bank is switched to different capacitance values by the calibration word, the range of output frequencies in which the voltage controlled capacitor may tune the VCO is shifted higher or lower. Thus, the tuning range of the VCO is widened without increasing the gain by incorporating both the capacitor bank and the voltage controlled capacitor, and by calibrating the capacitor bank in the VCO to select the desired coarse tuning range before enabling the fine tuning. The ability to lower the gain in the VCO reduces sensitivity to noise in the VCO and helps lower the phase noise at the synthesizer output.

As will be described in more detail below, in some embodiments of the present invention, the calibration process includes a digital circuit for performing a dichotomy algorithm, or a binary search through a tree of possible calibration word values. The calibration process in some particular instances may also include using an analog circuit to determine the least significant bit of the calibration word. The digital circuit resolves the calibration word down to two possible word values that are one bit apart, and the analog circuit selects between the two values. The optional analog circuit provides a more accurate calibration word while avoiding complex digital algorithms for resolving the last bit.

Figure 1A:
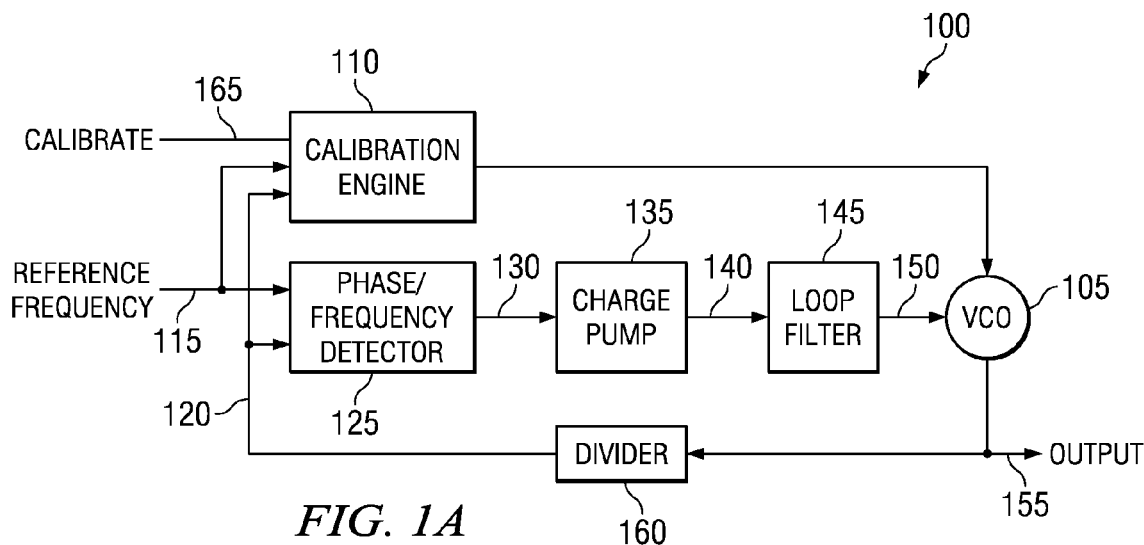
FIG. 1A is a block diagram of an exemplary phase locked loop having a voltage controlled oscillator and associated calibration engine.

Referring now to FIG. 1A, an exemplary phase locked loop (PLL) 100 having a voltage controlled oscillator 105 and associated calibration engine 110 is depicted. It should be noted that the wide tuning range VCO and associated calibration engine is not limited to use with any particular clock generation circuit such as the exemplary PLL 100 described herein. A reference frequency 115 and feedback signal 120 are provided at inputs of a phase/frequency detector 125 in the PLL 100. The reference frequency 115 may be generated by any suitable source, such as a crystal and crystal oscillator, and is not limited to any particular frequency. The output 130 of the phase/frequency detector is connected to the input of a charge pump 135, and the output 140 of the charge pump 135 is connected to the input of a loop filter 145. The output 150 of the loop filter 145 is switchably connected to the VCO 105, and particularly to the control input of a voltage controlled capacitor such as a varactor in the VCO 105. As will be described in more detail below, the control input of the voltage controlled capacitor may also be switchably connected to a fixed voltage while the calibration engine 110 performs a coarse tuning of the VCO 105. The output 155 of the VCO 105 is connected to a frequency divider 160, and the output of the frequency divider 160 is connected to the feedback signal input of the phase/frequency detector 125. During operation of the PLL 100, the frequency of the output 155 of the VCO 105 (or some multiple thereof) is locked to the reference frequency 115 at the input of the phase/frequency detector 125. This is done by adjusting the capacitance of the voltage controlled capacitor in the VCO 105 under control of the feedback loop through the divider 160, phase/frequency detector 125, charge pump 135 and loop filter 145. As the capacitance in the VCO 105 is changed, the time constant of an LC tank circuit in the VCO 105 is changed, varying the output frequency.

The calibration engine 110 is connected to the VCO 105 to select a capacitance value in a capacitor bank in the VCO 105 as described above. The calibration engine 110 has as inputs the reference frequency 115 and feedback signal 120 that may be taken from the inputs of the phase/frequency detector 125. The calibration engine 110 also has a calibrate signal input 165 that initiates the calibration process for coarse tuning of the VCO 105. The clock output from the PLL 100 may be taken either before or after the divider 160 as desired, such as at the output 155 of the VCO 105.

Figure 1B:
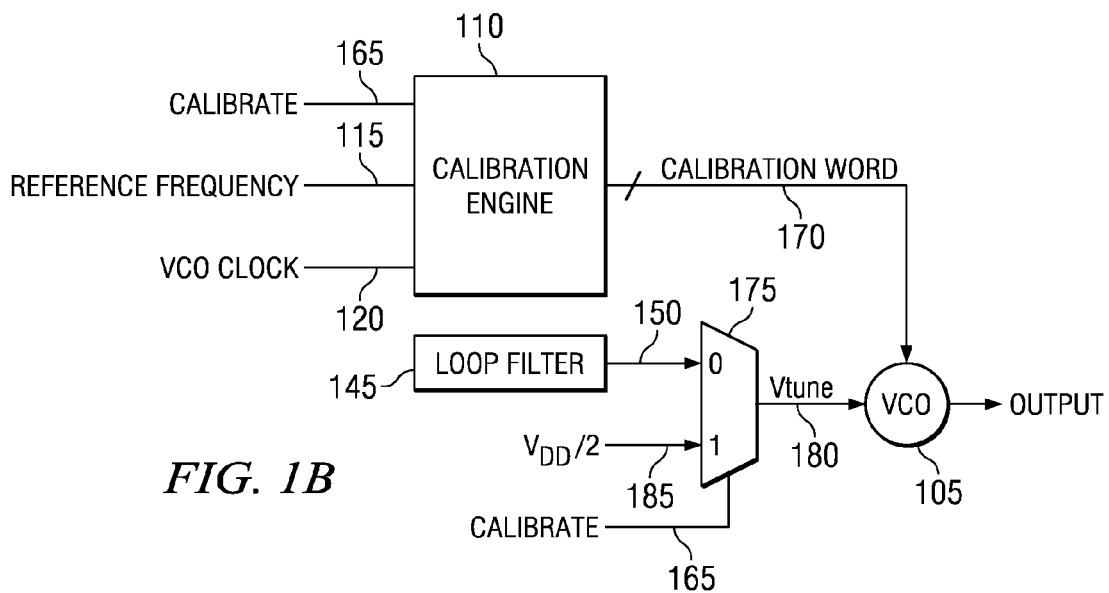
FIG. 1B is a block diagram of portions of the exemplary phase locked loop of 1A illustrating calibration signals used by the voltage controlled oscillator.

Referring now to FIG. 1B that shows a portion of a PLL 100, calibration signals used by the VCO 105 are described in more detail. The calibration engine 110 produces a calibration word 170 that is connected to the capacitor bank in the VCO 105. The calibration word 170 may be a multi-bit parallel signal with any width desired. The tuning range of the VCO 105 may be adapted as desired by factors including the width of the calibration word 170 and the granularity of the coarse tuning ranges provided by each setting of the capacitor bank. The output 150 of the loop filter 145 may be connected to the VCO 105 through any suitable switch 175 so that the control input 180 of the VCO 105 may be connected to the output 150 of the loop filter 145 during normal operation or to a fixed reference voltage 185 during calibration, under control of a calibrate signal 165. Note that FIG. 1B does not show the entire PLL 100, and in particular, does not show the entire feedback loop from the output of the VCO 105 to the input of the calibration engine 110. However, as mentioned above, the VCO clock input 120 to the calibration engine 110 may be taken straight from the VCO 105 output or may pass through a divider (e.g., 160) as desired.

Figure 2:
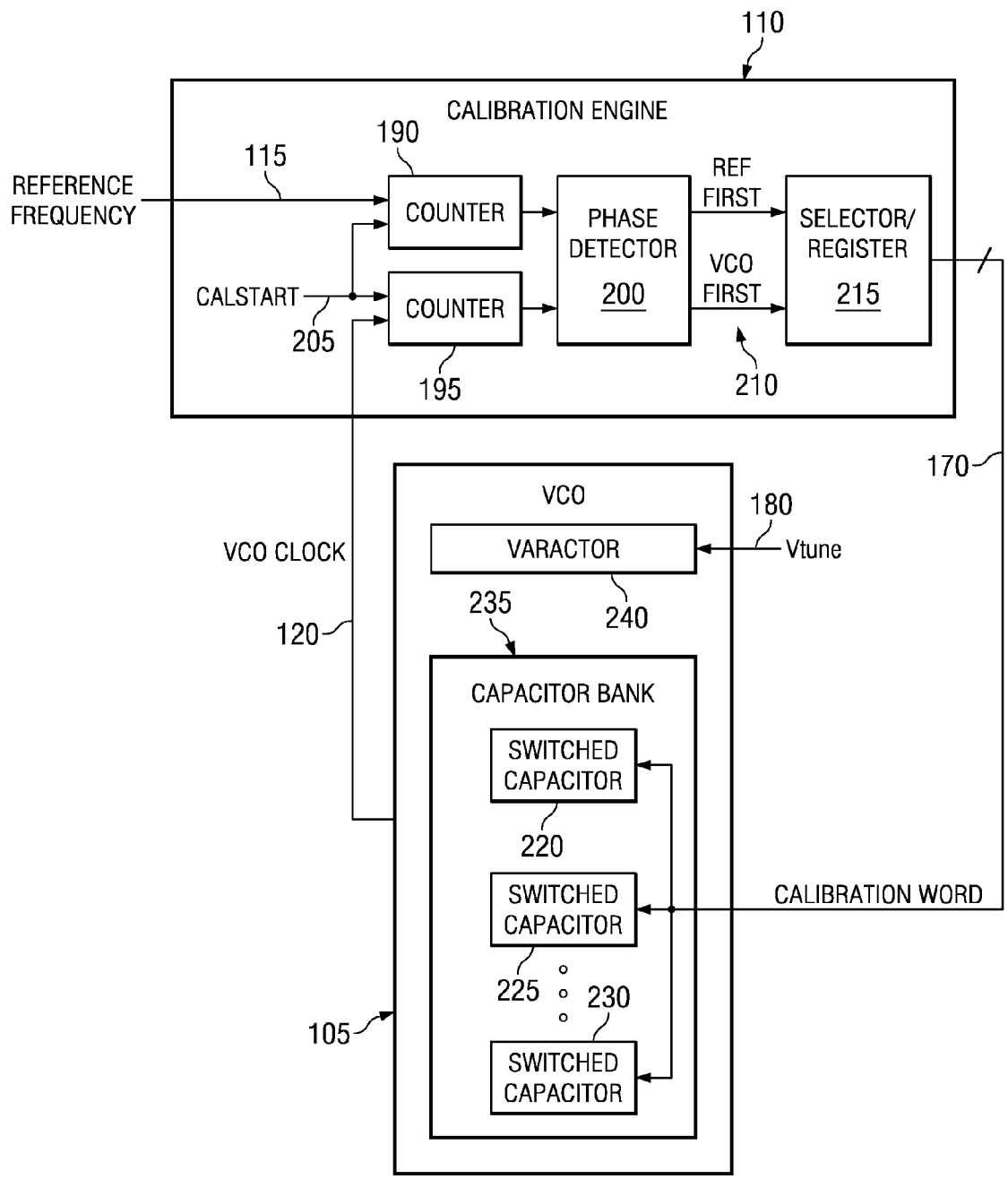
FIG. 2 is a block diagram of an exemplary calibration engine and voltage controlled oscillator.

One embodiment of the calibration engine 110 and VCO 105 is illustrated in more detail in FIG. 2. The reference frequency 115 and feedback signal or VCO clock 120 may be divided using circuit elements such as counters 190 and 195 to magnify differences in the frequencies, or may be compared undivided if desired. The frequency difference of the reference frequency 115 and VCO clock 120 may be detected using a phase detector 200 by triggering the counters 190 and 195 simultaneously and by using the phase detector 200 to detect which counter first reaches a predetermined number of cycles on the input. The counters 190 and 195 may be triggered simultaneously using a common trigger signal such as a start calibration stage (Calstart) signal 205. This signal 205 may be connected directly to the calibrate signal 165 (see FIGS. 1A and 1B) or may be derived therefrom to repeatedly cycle and perform multiple iterations during the calibration process to calculate multiple bits in the calibration word 170. The phase detector 200 produces an output 210 that indicates which of the counter outputs arrived first, or whether the reference frequency 115 or VCO clock 120 was faster. The phase detector output 210 is connected to a selector/register 215 that selects one of two possible values for the calibration word 170 depending on whether the reference frequency 115 or VCO clock 120 was faster. The calibration process performed by the digital circuit of the calibration engine 110 is thus a dichotomy algorithm or a binary search that iteratively selects between two possible values for the calibration word 170 depending on the relative speed of the reference frequency 115 and VCO clock 120, as will be described in more detail below.

The calibration word 170 is connected to a plurality of switched capacitors (e.g., 220, 225, 230) in a capacitor bank 235 in the VCO 105. Thus, as the calibration word 170 is changed by the calibration engine 110 in each iteration of the binary search, the overall capacitance of the LC tank circuit in the VCO 105 changes and the frequency of the VCO clock 120 changes accordingly. Each iteration of the binary search selects a capacitance value in the capacitor bank 235 that provides a coarse tuning range for the VCO 105 in which the reference frequency 115 is more nearly centered. During the iterations of the binary search, each time the VCO clock 120 changes frequency, the calibration engine 110 again compares the new frequency of the VCO clock 120 with the reference frequency 115 to further resolve the calibration word 170 so that the reference frequency 115 is most nearly centered in the coarse tuning range provided by the capacitor bank 235. Note that the VCO clock 120 may also pass through a divider 160 (not shown in the embodiment of FIG. 2) as illustrated in FIG. 1A before entering the calibration engine 110.

As mentioned above, the control voltage 180 to the voltage controlled capacitor or varactor 240 in the VCO 105 may be fixed during calibration to prevent the capacitance value of the varactor 240 from changing during the calibration process and skewing the results of the binary search for the calibration word 170. Once the calibration process in the calibration engine 110 is completed and the calibration word 170 is fixed, the control voltage 180 to the varactor 240 is released, allowing it to be adjusted by the output 150 of the loop filter 145 in the feedback loop in the exemplary embodiment of FIGS. 1A and 1B.

Figure 3:
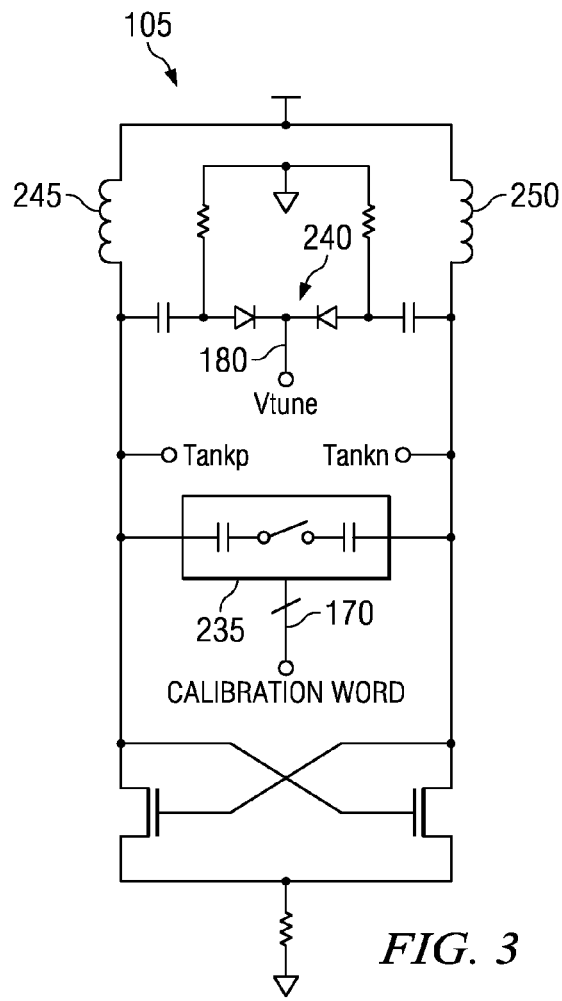
FIG. 3 is a block diagram of an exemplary voltage controlled oscillator.

Referring now to FIG. 3, an exemplary embodiment of the VCO 105 will be described in more detail. It is important to note that the calibration methods described herein are not limited to any particular type of oscillator, and that the VCO with a complementary cross-coupled LC tank circuit described herein is purely exemplary. The VCO 105 comprises an LC voltage controlled oscillator in which the varactor 180 and capacitor bank 235 form the capacitance of an LC tank circuit in the VCO 105 that also includes one or more inductors 245 and 250. As the capacitance of the varactor 180 and capacitor bank 235 are adjusted during calibration and normal operation, the time constant of the LC tank circuit changes and the VCO 105 charges and discharges, and thus oscillates, at different frequencies. Note that the varactor 180 and capacitor bank 235 are connected in parallel in the VCO 105 to provide an additive total capacitance, but that the VCO 105 may also be configured with the varactor 180 and capacitor bank 235 in series if desired.

Figure 4:
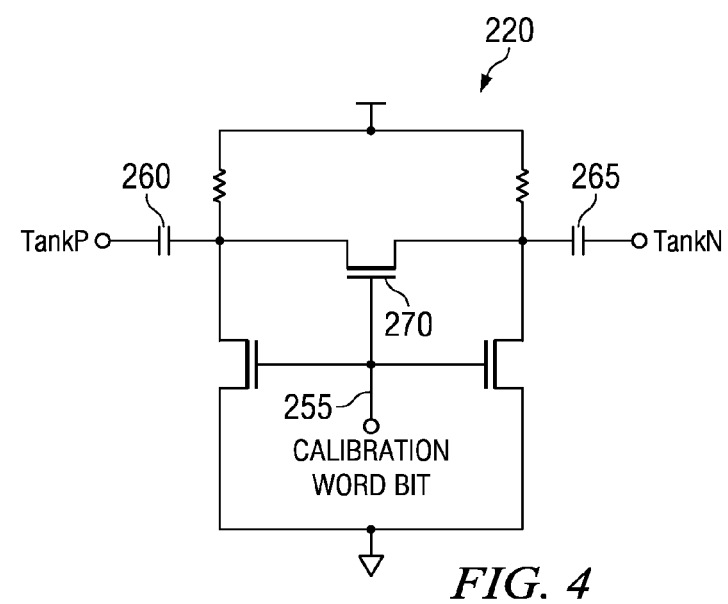
FIG. 4 is a schematic diagram of an exemplary switched capacitor as contained in a capacitor bank in a voltage controlled oscillator.

A switched capacitor 220 in the capacitor bank 235 is illustrated in more detail in FIG. 4. When a bit 255 of the calibration word is active, one or more capacitors 260 and 265 are connected through a switch 270. When the bit 255 is inactive, the capacitors 260 and 265 are disconnected and do not materially contribute to the overall capacitance of the capacitor bank 235. The additional transistors to ground aid in rendering capacitors 260 and 265 ineffective when switch 270 is open. The coupling NMOS device or switch 270 is much larger than the other two connected to ground. When the switch 270 is on the two capacitors 260 and 265 are shorted to each other. When the switch 270 is off the smaller transistors to ground provide a small series capacitance to ground leading to low impedance to ground rendering the capacitors 260 and 265 ineffective.

Figure 5:
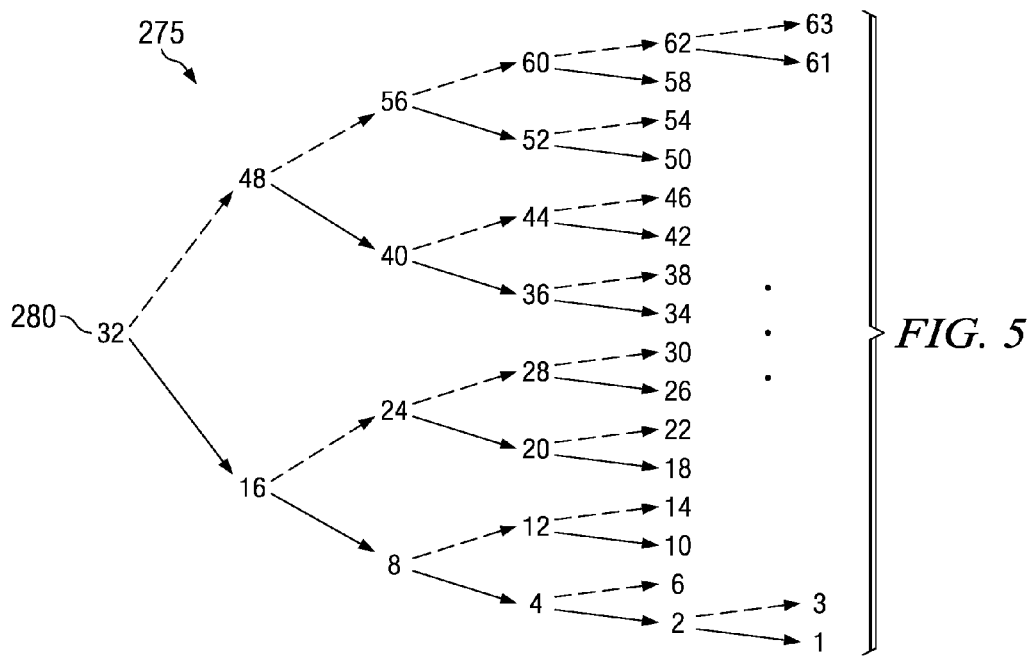
FIG. 5 is a decision tree illustrating an exemplary binary or dichotomy search algorithm for generating a calibration word in a calibration engine.

Referring now to FIG. 5, the dichotomy algorithm or binary search performed by the digital circuit in the calibration engine 110 will be described in more detail. A tree 275 of possible calibration word values from 1 to 63 illustrates the calibration word values that may be selected using five iterations of the binary search. (More or less iterations may be used as desired based on the number of possible values for the calibration word 170.) A central value 280 may be selected as an initial value for the calibration word 170. Note that the initial value is not necessarily the mean or median of the possible values of the calibration word 170, and any of the possible values may be selected for the initial value of the calibration word 170 as desired. In this exemplary embodiment, the initial value 280 of 32 for the calibration word 170 selects a roughly central capacitance value in the capacitor bank 235 and provides for a balanced tree 275 for the binary search.

When the calibration word 170 has been set to a value in the tree 275, such as the initial value 280 of 32, the reference frequency 115 and VCO clock 120 are compared and the result used to select the next of two possible values for the calibration word 170. If the VCO clock 120 is slower than the reference frequency 115, the lower of the two possible values for the calibration word 170 is selected, decreasing the capacitance of the capacitor bank 235 and increasing the frequency of the VCO clock 120. If the VCO clock 120 is faster than the reference frequency 115, the higher of the two possible values for the calibration word 170 is selected, increasing the capacitance of the capacitor bank 235 and decreasing the frequency of the VCO clock 120. Thus, if the VCO clock 120 is slower than the reference frequency 115, a descending path is taken through the tree 275 and if the VCO clock 120 is faster than the reference frequency 115, a rising path is taken through the tree 275 as it is illustrated in FIG. 5. As discussed above, the reference frequency 115 and VCO clock 120 may be divided before the comparison to magnify the difference in frequency and to make the result of the comparison more accurate. The reference frequency 115 and VCO clock 120 may be divided by any suitable amount to give the desired magnification, such as by 64.

Figure 6:
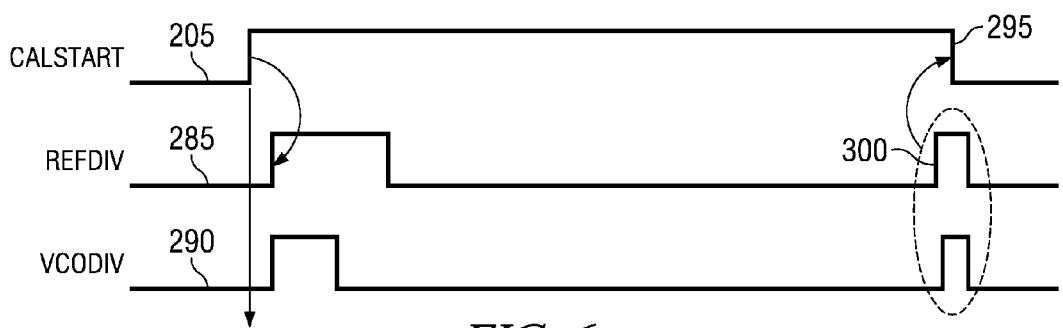
FIG. 6 is a timing diagram illustrating comparison of two clock signals in an exemplary binary search algorithm.

A timing diagram illustrating the comparison of divided versions of the two clock signals, the reference frequency 115 and VCO clock 120, used to navigate the binary tree 275 is illustrated in FIG. 6. Note that the reference frequency 115 and VCO clock 120 may have a 50% duty cycle or any other duty cycle depending on the design choices made. When a start calibration stage (Calstart) signal 205 is asserted, a divider such as the counters 190 and 195 of FIG. 2 is triggered, starting the divided clock signals refdiv 285 (the divided reference frequency 115) and vcodiv 290 (the divided VCO clock 120) simultaneously. A detector such as the phase detector 200 of FIG. 2 is used to determine which of the two divided clock signals 285 or 290 is faster. The Calstart signal 205 may be turned off 295 when the frequency difference has been detected and this state change used to start a next iteration of the binary search. Note that in the particular embodiment of FIG. 6, the counters 190 and 195 comprise ripple counters. The divided clock signals 285 and 290 are started simultaneously by holding the outputs of flip flops used in the ripple counters low until the reset is released. After the reset is released, the counter output goes high after as many CLK-Q delays as the number of stages in the ripple counters. Since the two clocks may not be synchronous to each other, the first rising edge out of their respective clocks may not be exactly aligned. In order to minimize this, the reset signal is synchronized to the rising edge of the reference clock first. This synchronized reset is then used to allow both ripple counters to start counting. There may be a remaining error due to the difference between the timing of the first rising edge of the reference clock 115 after reset and the divided VCO clock 120 due to the latency of the feedback path (the time from releasing the reset to first rising edge). This additional delay in the feedback path may be compensated for approximately by a string of buffers inserted in the path of the reference frequency 115 to match the feedback path latency. The initial pulses shown in FIG. 6 on the reference clock 115 and the divided VCO clock 120 are due to the use of ripple counters and is not used in the determination of which of the two divided clock signals 285 or 290 is faster.

In the exemplary case illustrated in FIG. 6, the refdiv 285 signal rises 300 first, meaning that the VCO clock 120 is slower than the reference frequency 115 and the lower of the two possible values for the calibration word 170 is selected. In this example, with the calibration word 170 starting at a value 280 of 32 and the VCO clock 120 being slower than the reference frequency 115, the tree 275 is descended and the next value for the calibration word 170 is 16. If, during the next iteration of the binary search, the VCO clock 120 were faster than the reference frequency 115, the tree 275 would be ascended and the next value for the calibration word 170 would be 24. Successive iterations in the binary search are performed by the digital circuit in the calibration engine 110 until the tree 175 has been fully navigated and the calibration word 170 is resolved down to two possible words which are 1 bit apart. For example, if the binary search results in a calibration word of 63, the actual value of the calibration word 170 that would select a capacitance value in the capacitor bank 235 to provide a coarse tuning range in which the reference frequency 115 is most nearly centered may be either 62 or 63.

Figure 7:
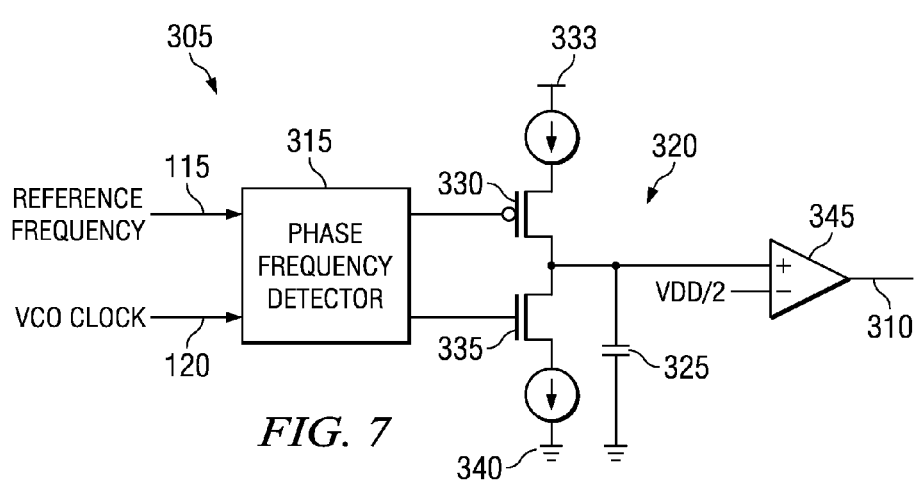
FIG. 7 is a schematic diagram of an exemplary analog circuit for determining the least significant bit of a calibration word.

The calibration word 170 selected by the binary search performed by the digital tuning circuit in the calibration engine 110 may be used as is if desired, or the least significant bit of the calibration word 170 may be further resolved by an analog tuning circuit in the calibration engine 110. Referring now to FIG. 7, an exemplary analog circuit 305 for selecting between two possible calibration words 170 that are one bit apart will be described. Note that the analog circuit 305 may also be used to select between two more widely separated calibration words if desired. Note also that the exemplary analog circuit 305 is not shown in the calibration engine 110 of FIG. 2. In this exemplary embodiment, the analog circuit 305 would also be placed in the calibration engine 110 and would share the same inputs 115 and 120 of the digital circuit, with an output 310 being connected to the selector/register 215 to set the least significant bit of the calibration word 170.

A phase/frequency detector 315 compares the reference frequency 115 and the VCO clock 120 and converts the time difference between the rising edges of the reference frequency 115 and the VCO clock 120 to pulses that drive a charge pump 320 to either increase or decrease the voltage on a capacitor 325 in the charge pump 320 from its precharged value. As with the digital circuit described above, the reference frequency 115 and the VCO clock 120 may be divided before comparison in one embodiment of the analog circuit 305. The analog circuit 305 selects the least significant bit of the calibration word 170 in two stages. At the beginning of the first stage, the capacitor 325 in the charge pump 320 is precharged to a midpoint voltage level. The term midpoint voltage level is used herein to refer to any voltage level in a range between the upper and lower operating voltages such that the capacitor 325 can be further charged or discharged from the midpoint voltage level. The midpoint voltage level is not necessarily at a voltage level exactly between the upper and lower operating voltages such as halfway between Vdd and ground (or Vdd/2). One of the two possible calibration words 170 is selected, and the phase/frequency detector 315 performs the comparison described above. The resulting pulse from the phase/frequency detector 315 is proportional to the frequency difference between the reference frequency 115 and the VCO clock 120 and is used to increase the voltage on the capacitor 325 from its precharged value by turning on the pmos transistor 330 in the charge pump 320 and pulling the capacitor 325 up to Vdd 333.

The second stage then begins by selecting the second of the two possible calibration words 170 and comparing the frequency of the reference frequency 115 and the VCO clock 120 again as described above but with the different capacitance value based on the different calibration word 170. The resulting pulse from the phase/frequency detector 315 is used to decrease the voltage on the capacitor 325 from its previous value by turning on the nmos transistor 335 in the charge pump 320 and pulling the capacitor 325 down to ground 340.

Figure 8A:
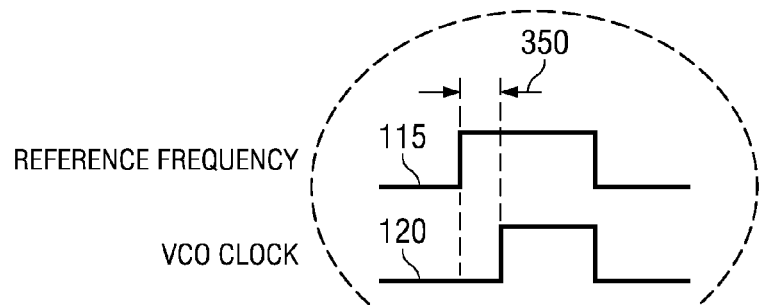
FIG. 8A is a timing diagram illustrating a phase difference between a reference frequency and a VCO clock used to charge a charge pump in the analog circuit of FIG. 7.
Figure 8B:
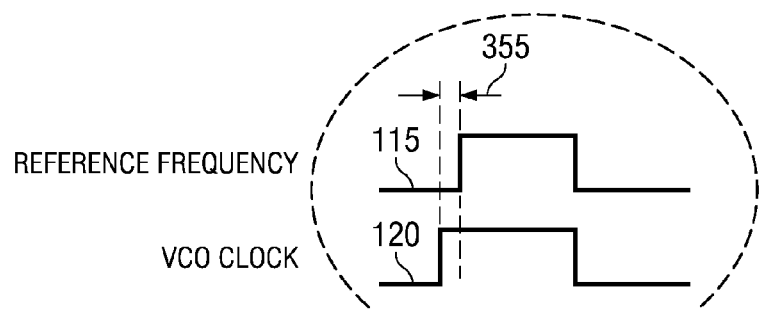
FIG. 8B is a timing diagram illustrating a phase difference between a reference frequency and a VCO clock used to discharge a charge pump in the analog circuit of FIG. 7.

The final voltage on the capacitor 325 after the two stages is compared to its precharged value, in this case Vdd/2, in a comparator 345. The output 310 of the comparator 345 is used by the calibration engine 110 to set the least significant bit of the calibration word 170. FIGS. 8A and 8B contain timing diagrams showing exemplary time differences between the rising edges of the reference frequency 115 and the VCO clock 120 for the two stages of the least significant bit selection in the analog circuit 305. The time difference between the leading edges of the reference frequency 115 and the VCO clock 120 has a greater amount 350 in the first stage (FIG. 8A) than the amount 355 in the second stage (FIG. 8B). Note that it is the time difference between rising edges of the reference frequency 115 and the VCO clock 120 that is measured by the analog circuit when comparing frequencies, and not which of the reference frequency 115 and the VCO clock 120 is faster. This time difference between rising edges is also referred to herein as a frequency difference magnitude.

Figure 9:
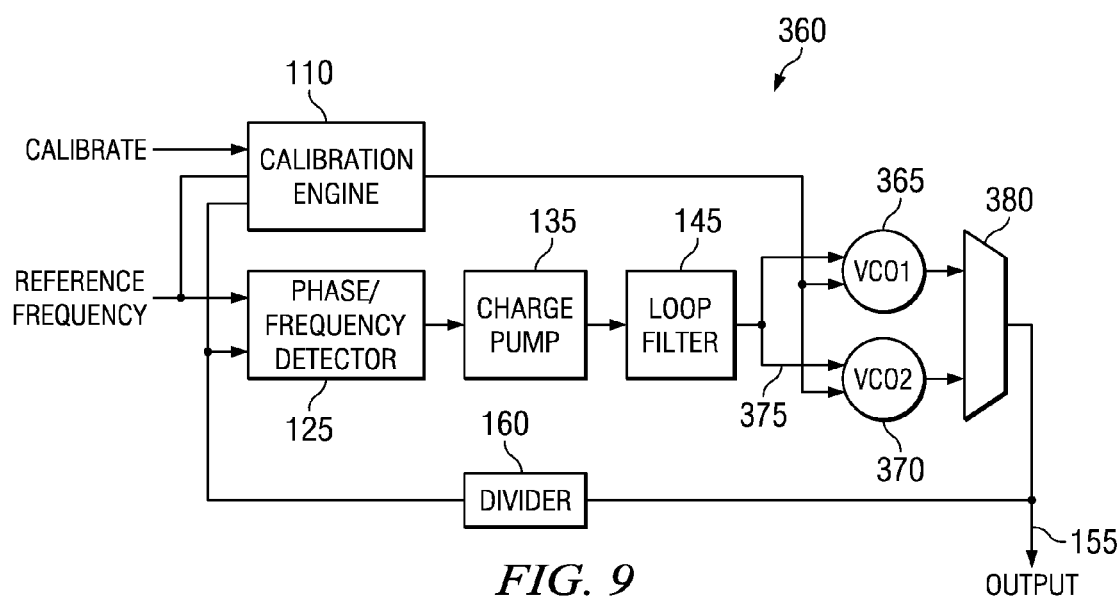
FIG. 9 is a block diagram of an exemplary phase locked loop having two parallel voltage controlled oscillators and an associated calibration engine shared by the two voltage controlled oscillators.

Referring now to FIG. 9, another exemplary embodiment of a PLL 360 may include multiple VCO's 365 and 370, thereby increasing the tuning range of the PLL 360 by as much as a factor of two for a PLL with two VCO's. As with the exemplary PLL 100 described above, the PLL 360 includes a divider 160, phase/frequency detector 125, charge pump 135 and loop filter 145 in a feedback loop between the output 155 and input 375 of the VCO's 365 and 370. A selector 380 such as a multiplexer is used to select the output of one of the two VCO's 365 and 370. The PLL 360 may include a single calibration engine 110 shared by both VCO's 365 and 370, in which case a fixed capacitance in the second VCO 370 offsets its frequency from that of the first VCO 365 by a known amount to separate the coarse tuning ranges of each VCO. In another embodiment, each VCO 365 and 370 may have a dedicated calibration engine (not shown), in which case each VCO 365 and 370 is selected in turn and the associated calibration engine runs the calibration process to determine and fix the appropriate calibration word from each calibration engine.

Figure 10:
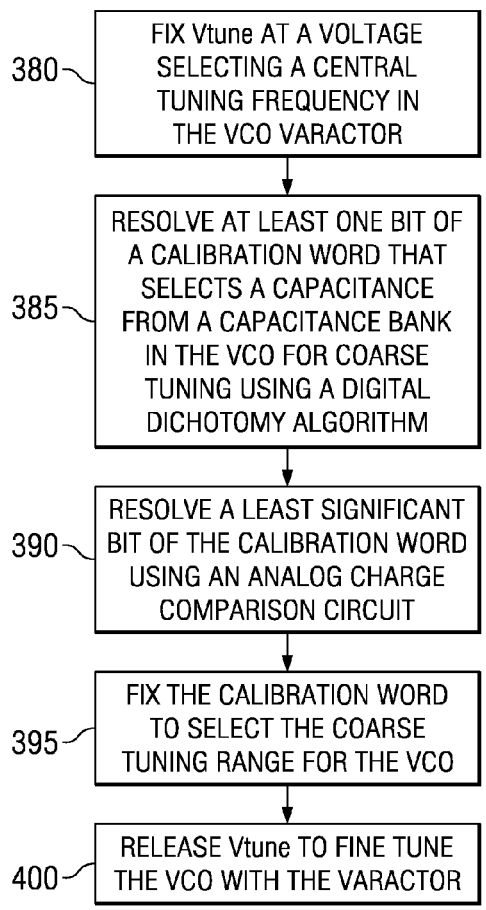
FIG. 10 is a flow chart of an exemplary operation for calibrating a voltage controlled oscillator, including both a binary search performed by a digital circuit and a selection of a least significant bit of a calibration word by an analog circuit.

Referring now to FIG. 10, an exemplary operation for calibrating a VCO will be summarized. The control input of a varactor in the VCO is fixed 380 at a voltage that selects a central tuning frequency in the varactor. Note that this does not have to be the average of the upper and lower operating voltages (e.g., Vdd/2). The voltage merely provides frequency margins on both sides so that the varactor can tune up and down within the range selected by the calibration word. This enables the varactor to tune the VCO both up and down within the coarse tuning range selected by the calibration word, thereby maintaining a lock with the reference frequency despite frequency variations due, for example, to temperature fluctuations in the clock circuit. The calibration word that selects a capacitance from a capacitance bank in the VCO is resolved 385 using a digital dichotomy algorithm or binary search as discussed above. The least significant bit of the calibration word may be resolved 390 using an analog charge comparison circuit. The calibration word used to select the coarse tuning range for the VCO is fixed 395, and the control input of the VCO varactor is released 400 to enable a feedback loop or other signal to fine-tune the VCO frequency within the coarse tuning range selected by the calibration word.

Figure 11:
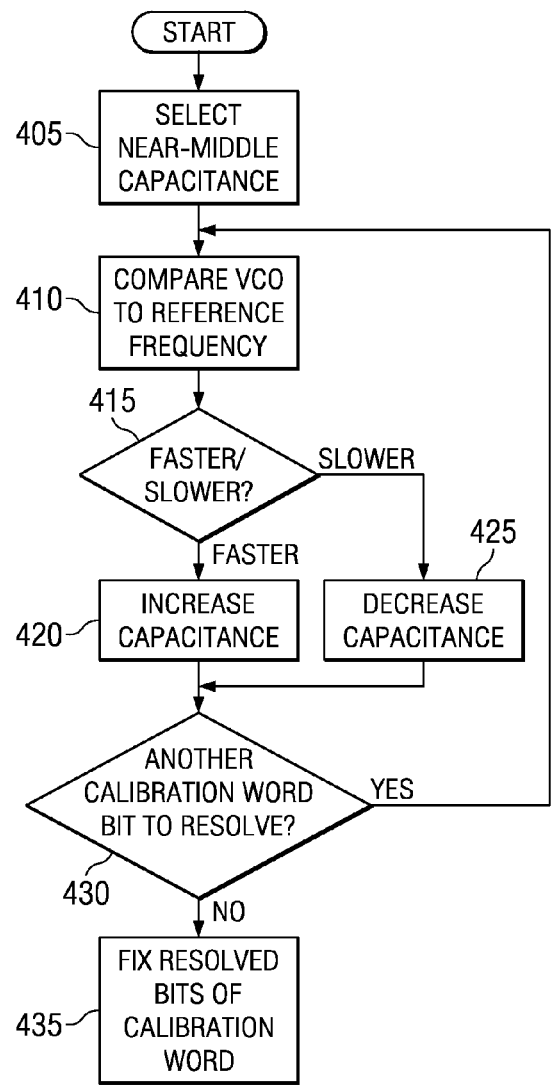
FIG. 11 is a flow chart of an exemplary binary search for a calibration word that may be performed by a digital circuit.

An exemplary digital dichotomy algorithm used to select a calibration word will be described with reference to the flow chart of FIG. 11. A near-middle capacitance value is selected 405 by an initial value for the calibration word as described above. The frequency of the VCO clock is compared 410 with the reference frequency. If 415 the VCO clock is faster than the reference frequency, a calibration word is selected that increases 420 the capacitance of the capacitor bank in the VCO. If 415 the VCO clock is slower than the reference frequency, a calibration word is selected that decreases 425 the capacitance of the capacitor bank in the VCO. If 430 the calibration word may be resolved further, the digital dichotomy algorithm performs another iteration beginning with the comparison 410 of the VCO clock frequency and the reference frequency. If 430 the calibration word is resolved to the extent desired by the digital dichotomy algorithm, such as down to one of two possible calibration words that are one bit apart, the calibration word may be fixed 435 at the resolved value.

Figure 12:
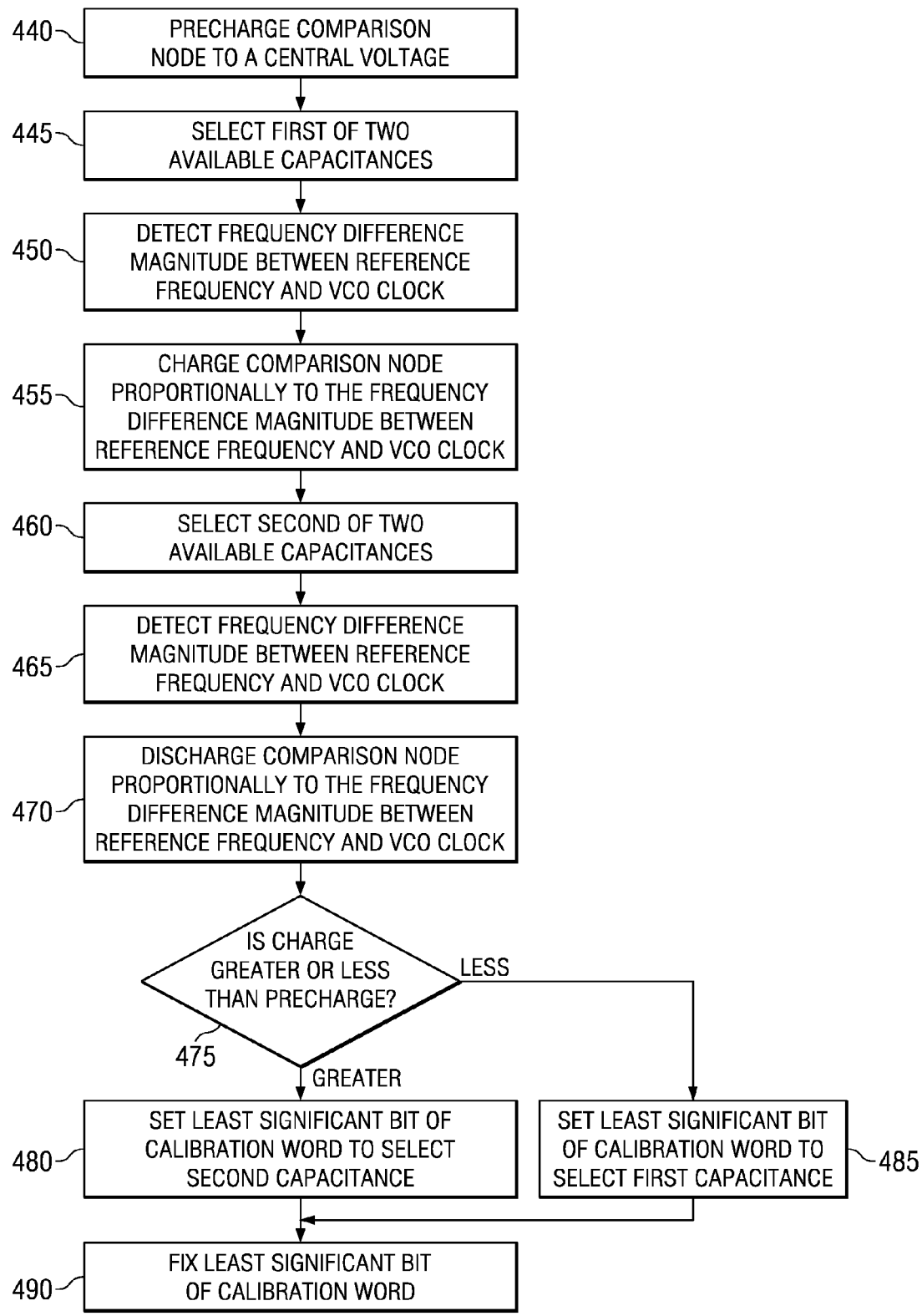
FIG. 12. is a flow chart of an exemplary operation for selection of a least significant bit of a calibration word by an analog circuit.

An exemplary operation for selecting one of two possible calibration words in an analog circuit will be described with reference to the flow chart of FIG. 12. The two possible calibration words may comprise calibration word values that remain unresolved after a dichotomy algorithm or binary search as described above. A comparison node in the analog circuit, such as the capacitor in a charge pump, is precharged 440 to a central voltage. Again, the central voltage is not necessarily an exact midpoint between upper and lower operating voltages, but may comprise any voltage that allows further charging and discharging of the comparison node. The first of two available capacitances is selected 445. The magnitude of the difference between the reference frequency and the frequency of the VCO clock is detected 450. The comparison node is charged 455 proportionally to the frequency difference magnitude between the reference frequency and the frequency of the VCO clock. The second of two available capacitances is selected 460. The magnitude of the difference between the reference frequency and the frequency of the VCO clock is detected 465. The comparison node is discharged 470 proportionally to the frequency difference magnitude between the reference frequency and the frequency of the VCO clock. The charge remaining on the comparison node is compared 475 with the precharge voltage. If the charge is greater than the precharge voltage, the least significant bit of calibration word is set 480 to select the second capacitance. If the charge is less than the precharge voltage, the least significant bit of calibration word is set 485 to select the first capacitance. The least significant bit of the calibration word is then fixed 490.

Based on the disclosure provided herein, one of ordinary skill in the art will recognize a myriad of advantages that may be achieved through use of one of more embodiments of the present invention. For example, it will be recognized that a wide tuning range may be provided by a VCO without increasing the gain and subsequent noise sensitivity of the VCO. The ability to lower the gain in the VCO reduces sensitivity to noise in the VCO and helps lower the phase noise at the synthesizer output. Large changes in the coarse tuning of the VCO may be made once, such as during power up or reset, leaving only fine tuning within the selected coarse tuning range to be performed during operation. A digital dichotomy algorithm may be used to quickly and simply select a calibration word for a switched bank of capacitors in the VCO, with an analog circuit to accurately resolve the least significant bit of the calibration word.

In conclusion, the present invention provides novel systems, apparatus, methods for clock generation. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
   a voltage controlled oscillator (VCO) having a plurality of switchable capacitors and a voltage controlled adjustable capacitor; and
   a calibration engine having a reference frequency input that receives a reference signal, a VCO input that is coupled to VCO so as to receive an output from the VCO, and a calibration word output that is coupled to each of switchable capacitors wherein the calibration engine includes:
   a digital binary search circuit that is coupled to the reference frequency input, the VCO input and the calibration word output, wherein the digital binary search circuit generates at least a portion of a calibration word that is provided to the calibration word output; and an analog tuning circuit that is coupled to the reference frequency input, the VCO input, and the calibration word output, wherein the analog tuning circuit generates a least significant bit (LSB) of the calibration word.

2. The apparatus of claim 1, wherein the digital binary search circuit further comprises:
a frequency comparator that is coupled to the reference frequency input and the VCO input;
a selector that is coupled to an output of the frequency comparator and the calibration word output so as to generate the portion of the calibration word.

3. The apparatus of claim 2, wherein the frequency comparator further comprises:
a first counter that is coupled to the reference frequency input and an enable input;
a second counter that is coupled to the VCO input and the enable input, wherein the enable input receives a start calibration signal;
a phase detector that is coupled to the first counter, the second counter and the selector.

4. The apparatus of claim 1, wherein the analog tuning circuit further comprises:
a phase detector that is coupled to the reference frequency input and the VCO input;
a charge pump that is coupled to the phase detector; and
a comparator having a first input coupled to the charge pump and a second input coupled to a reference voltage fixed at the midpoint voltage level, wherein the comparator generates the LSB of the calibration word.

5. The apparatus of claim 4, wherein the analog tuning circuit further comprises:
a first frequency divider that is coupled between the reference frequency input and the phase detector; and
a second frequency divider that is coupled between the VCO input the phase detector.

6. The apparatus of claim 1, wherein the apparatus further comprises a phase locked loop having:
a phase/frequency detector that receives the reference signal;
a charge pump that is coupled the phase/frequency detector;
a loop filter that is coupled to the charge pump; and
a divider that is coupled between the VCO and the phase/frequency detector.

7. A method of calibrating a VCO, the method comprising:
fixing a control voltage of a fine tune capacitor in the VCO at a predetermined level;
performing a binary search in a digital circuit for a value of a calibration word, the calibration word enabling at least one of a plurality of switched capacitors in a coarse tune capacitor bank in the VCO;
using an analog circuit to select a value of a least significant bit of the calibration word, wherein the calibration word is fixed at the value determined by the binary search and the analog circuit;
fixing the calibration word at the value determined by the binary search; and
releasing the control voltage of the fine tune capacitor to enable adjustment of the control voltage by a feedback signal to the voltage controlled oscillator.

8. The method of claim 7, wherein the binary search comprises:
comparing a frequency of an output of the voltage controlled oscillator with a reference frequency;
if the output is faster than the reference frequency, selecting a calibration word that increases a capacitance of the coarse tune capacitor bank and lowers the frequency of the output of the voltage controlled oscillator; and
if the output is slower than the reference frequency, selecting a calibration word that decreases a capacitance of the coarse tune capacitor bank and increases the frequency of the output of the voltage controlled oscillator.

9. The method of claim 8, wherein the binary search comprises multiple iterations of the comparison and calibration word selection, and wherein the comparison selects between closer possible values of the calibration word in each subsequent iteration.

10. The method of claim 9, wherein the binary search iterations are continued until the calibration word is resolved to within two possible values one bit apart.

11. The method of claim 9, wherein a calibration word is selected at a beginning of the binary search that selects a central capacitance value in the coarse tune capacitor bank.

12. The method of claim 8, wherein the binary search further comprises dividing the frequency of the output of the voltage controlled oscillator and the reference frequency by a known amount before the step of comparing.

13. The method of claim 7, wherein the value of the calibration word selected by the binary search selects a capacitance value in the capacitor bank to provide a coarse tuning range in which a reference frequency is most nearly centered.

14. The method of claim 7, wherein the selection of the value of the least significant bit of the calibration word by the analog circuit comprises:
precharging a signal to a predetermined precharge voltage;
selecting a first value for the least significant bit;
detecting a first frequency difference magnitude between a frequency of an output of the voltage controlled oscillator and a reference frequency;
charging the signal proportionally to the first frequency difference magnitude;
selecting a second value for the least significant bit;
detecting a second frequency difference magnitude between the frequency of the output of the voltage controlled oscillator and the reference frequency;
discharging the signal proportionally to the second frequency difference magnitude;
comparing the charge on the signal with the predetermined precharge voltage;
if the charge is greater than the predetermined precharge voltage, selecting the first value for the least significant bit of the calibration word; and
if the charge is less than the predetermined precharge voltage, selecting the second value for the least significant bit of the calibration word.

15. The method of claim 14, wherein the selection of the value of the least significant bit of the calibration word by the analog circuit further comprises dividing the frequency of the output of the voltage controlled oscillator and the reference frequency by a predetermined value before detecting the first and second frequency difference magnitudes.

16. An apparatus comprising:
a VCO including:
a first node;
a second node;
an inductive network that is coupled between the first and second nodes;
a first capacitive network that is coupled between the first and second nodes and that receives a control voltage;

a second capacitive network having a plurality of switchable capacitors that are each coupled between the first and second nodes;

a first transistor having a first passive electrode, a second passive electrode, and a control electrode, wherein the first passive electrode of the first transistor is coupled to the first node, and wherein the control electrode of the first transistor is coupled to the second node;

a second transistor having a first passive electrode, a second passive electrode, and a control electrode, wherein the first passive electrode of the second transistor is coupled to the second node, and wherein the control electrode of the second transistor is coupled to the first node;

a calibration engine that is coupled to each of the switchable capacitors so as to provide a calibration word to the VCO, wherein the calibration engine includes:

a digital binary search circuit that is coupled to the first and second nodes and that receives a reference signal, wherein the digital binary search circuit generates at least a portion of the calibration word; and an analog tuning circuit that is coupled to the first and second nodes and that receives the reference signal, wherein the analog tuning circuit generates an LSB of the calibration word.

17. The apparatus of claim 16, wherein the digital binary search circuit further comprises:

a first counter that receives the reference signal;

a second counter that is coupled to the first and second nodes;

a phase detector that is coupled to the first and second counters; and a selector that is coupled to the phase detector and to at least one of the switchable capacitors.

18. The apparatus of claim 16, wherein the analog tuning circuit further comprises:

a phase/frequency detector that receives the reference frequency and that is coupled to the first and second nodes;

a charge pump that is coupled to the phase/frequency detector; and a comparator that is coupled to the charge pump and that receives a reference voltage.

19. The apparatus of claim 16, wherein the apparatus further comprises:

a phase/frequency detector that receives the reference signal;

a charge pump that is coupled to the phase/frequency detector;

a loop filter that is coupled to the charge pump and the impedance network of the VCO;

a divider that is coupled to the first node, the second node, and the phase/frequency detector.

* * * * *